(12) United States Patent
Li et al.

(10) Patent No.: US 7,893,495 B2
(45) Date of Patent: *Feb. 22, 2011

(54) THIN FILM TRANSISTOR

(75) Inventors: Yuning Li, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/360,164

(22) Filed: Jan. 27, 2009

(65) Prior Publication Data

US 2009/0127552 A1 May 21, 2009

Related U.S. Application Data

(63) Continuation of application No. 11/546,857, filed on Oct. 12, 2006, now Pat. No. 7,511,343.

(51) Int. Cl.
*H01L 29/22* (2006.01)
(52) U.S. Cl. ........................ 257/347; 257/614
(58) Field of Classification Search ............ 257/347, 257/614, 618, 627, 410
See application file for complete search history.

(56) References Cited

U.S. PATENT DOCUMENTS

| 7,511,343 B2 * | 3/2009 | Li et al. ................... 257/347 |
| 2006/0197064 A1 | 9/2006 | Pan et al. |
| 2006/0214312 A1 | 9/2006 | Wu et al. |

2007/0287221 A1 12/2007 Ong et al.

FOREIGN PATENT DOCUMENTS

WO    WO 2006/081511 A2    8/2006

OTHER PUBLICATIONS

Nishio et al., "Preparation of highly oriented thin film exhibiting transparent conduction by the sol-gel process", Journal of Materials Science 31, (1996), pp. 3651-3656.
Sun et al., "Solution-Processed Zinc Oxide Field-Effect Transistors Based on Self-Assembly of Colloidal Nanorods", Nano Letters, 2005, vol. 5, No. 12, 2408-2413.
Takahashi et al., "Photoconductivity of Ultrathin Zinc Oxide Films", Jpn J. Appl. Phys., vol. 33 (1994), pp. 6611-6615.
Norris et al., "Spin-coated zinc oxide transparent transistors", J. Phys. D: Appl. Phys., 36(2003) L105-L107.
Park et al., "Structural and Optical Properties of ZnO Thin Films Grown by RF Magnetron Sputtering on Si Substrates", Journal of the Korean Physical Society, vol. 45, Dec. 2004, pp. S0697~S700.
Monge et al., "Room-Temperature Organometallic Synthesis of Soluble and Crystalline ZnO Nanoparticles of Controlled Size and Shape", Angew. Chem., 2003, 115, 5479-5482.

(Continued)

*Primary Examiner*—Mark Prenty
(74) *Attorney, Agent, or Firm*—Fay Sharpe LLP

(57) ABSTRACT

A thin film transistor is disclosed comprising comprises a substrate, a dielectric layer, and a semiconductor layer. The semiconductor layer, which is crystalline zinc oxide preferentially oriented with the c-axis perpendicular to the plane of the dielectric layer or substrate, is prepared by liquid depositing a zinc oxide nanodisk composition. The thin film transistor has good mobility and on/off ratio.

3 Claims, 2 Drawing Sheets

OTHER PUBLICATIONS

Peng et al., "Polymer-Controlled Crystallization of Zinc Oxide Hexagonal Nanorings and Disks", J. Phys. Chem. B, 2006, 110, 2988-2993.

Bao et al., "Sol-gel-derived c-axis oriented ZnO thin films", Thin Solid Films, 312 (1998), pp. 37-39.

Fujihara et al., "Crystallization behavior and origin of c-axis orientation in sol-gel-derived ZnO:Li thin films on glass substrates", Applied Surface Science, 180 (2001), 341-350.

Ohyama et al., "Preparation of ZnO Films with Preferential Orientation by Sol-Gel Method", Journal of the Ceramic Society of Japan, 104 [4] (1996), 296-300.

Fortunato et al., "Fully Transparent ZnO Thin-Film Transistor Produced at Room Temperature", Adv. Mater., 2005, 17, No. 5, pp. 590-594.

C.X. Xu et al., Zinc oxide nanodisk, Applied Physics Letters, Oct. 25, 2004, pp. 3878-3880. Vol. 85, No. 17, American Institute of Physics.

* cited by examiner

THIN FILM TRANSISTOR

This application is a continuation of U.S. patent application Ser. No. 11/546,857, filed Oct. 12, 2006. That application is hereby fully incorporated by reference in its entirety.

BACKGROUND

The present disclosure relates to a thin film transistor. In particular, the thin film transistor comprises a substrate and an oriented zinc oxide semiconductor layer.

Zinc oxide (ZnO) is known as a channel semiconductor in thin film transistors ("TFTs"). It is readily available and can be processed at ambient temperatures. It also has very high electron mobility (bulk mobility as high as 155 $cm^2$/V·sec and field effect mobility of 70 $cm^2$/V·sec), is environmentally stable, has a large band gap, is non-toxic, and inexpensive.

However, the method by which the semiconductor is fabricated will affect the mobility of the ZnO semiconductor layer. A ZnO semiconductor having high mobility (5-20 $cm^2$/V·sec) is generally made only through radio-frequency magnetron sputtering. Such equipment is expensive and leads to high production costs. In another approach, ZnO precursors were used, then processed to form a ZnO semiconductor layer. However, this approach requires an annealing step at a temperature of 400-550° C. Such temperatures are not suitable for substrates which deform at lower temperatures, like polymeric substrates, such as for example polyester, polycarbonate, polyimide films or sheets. ZnO semiconductors have also been made at low (ambient) temperatures using ZnO nanoparticles or nanorods in solution. However, such semiconductors have low mobility (~0.6 $cm^2$/V·sec).

Zinc oxide thin film crystal usually has a Wurtzite structure (hexagonal symmetry) with lattice parameters a=3.2960 and c=5.2065 Å. The orientation of the zinc oxide can be analyzed using for example x-ray diffraction (XRD) technique. For randomly oriented zinc oxide crystals three peaks can be observed with d-spacing distance of d=2.81, 2.60, 2.48 Å for (100), (002), and (101) plane, respectively, by using Cu Kα radiation (λ 1.5418 Å). The intensity ratios of these peaks in a randomly oriented zinc oxide powder sample are respectively about $I_{(100)}/I_{(002)}/I_{(101)}$=57/44/100 (intensities are obtained from ICDD/JCPDS card No. 36-1451 provided by The International Centre for Diffraction Data®). For randomly oriented zinc oxide crystals, the percentage of the intensity of the (002) peak relative to the sum of intensities of (100), (002), and (101) peak, $I_{(100)}+I_{(002)}+I_{(101)}$, $I_{(002)}/[I_{(100)}+I_{(002)}+I_{(101)}] \times 100\%$, is about 22%±2%.

The following documents provide additional background information:

E. Fortunato et al., "Fully Transparent ZnO Thin-Film Transistor Produced at Room Temperature," *Adv. Mater.*, Vol. 17, No. 5, pp. 590-594 (Mar. 8, 2005).

T. E. Park et al., "Structural and Optical Properties of ZnO Thin Films Grown by RF Magnetron Sputtering on Si Substrates," *J. Korean Phys. Soc.*, Vol. 45, pp. S697-S700 (December 2004).

B. J. Norris et al., "Spin coated zinc oxide transparent transistors," *J. Phys. D: Appl. Phys.*, Vol. 36, pp. L105-L107 (2003).

B. Sun et al., "Solution-Processed Zinc Oxide Field-Effect Transistors Based on Self-Assembly of Colloidal Nanorods," *Nano Lett.*, Vol. 5, No. 12, pp. 2408-2413 (2005).

Y. Takahashi et al, "Photoconductivity of Ultrathin Zinc Oxide Films," *Jpn. J. Appl. Phys.*, Vol. 33, pp. 6611-6615 (1994).

D. Bao et al., "Sol-gel derived c-axis oriented ZnO thin films," *Thin Solid Films*, Vol. 312, pp. 37-39 (1998).

M. Ohyama et al., "Preparation of ZnO Films with Preferential Orientation by Sol-Gel Method," *J. Cer. Soc. Jpn.*, Vol. 104, pp. 296-300 (1996).

S. Fujihara et al., "Crystallization behavior and origin of c-axis orientation in sol-gel-derived ZnO:Li thin films on glass substrates," *Appl. Sur. Sci.*, Vol. 180, pp. 341-350 (20011)

K. Nishio et al., "Preparation of highly oriented thin film exhibiting transparent conduction by the sol-gel process," *J. Mater. Sci.*, Vol. 31, pp. 3651-3656 (1996).

TFTs are generally composed of, on a substrate, an electrically conductive gate, source and drain electrodes, an electrically insulating gate dielectric layer which separated the gate electrode from the source and drain electrodes, and a semiconducting layer which is in contact with the gate dielectric layer and bridges the source and drain electrodes.

SUMMARY OF THE DISCLOSURE

The present disclosure relates to, in various embodiments, a thin film transistor comprising a substrate, a dielectric layer, and a semiconductor layer, wherein the semiconductor layer comprises zinc oxide nanodisks oriented with their c-axis perpendicular to the dielectric layer or the substrate.

In further embodiments, the dielectric layer or the substrate has a surface which includes or has been modified to include at least one type of polar functional group. The polar functional group further interacts with the nanodisks, helping them self-assemble into a properly oriented zinc oxide semiconductor layer.

In additional embodiments, the substrate may have a deformation temperature below 300° C. The substrate can be a polymeric substrate, such as for example polyester, polycarbonate, polyimide films or sheets.

In still further embodiments, the semiconductor of the TFT of the present disclosure has a mobility of at least 1 $cm^2$/V·sec. In more specific embodiments, the TFT has a mobility of at least 5 $cm^2$/V·sec.

Processes for making such TFTs are also disclosed.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
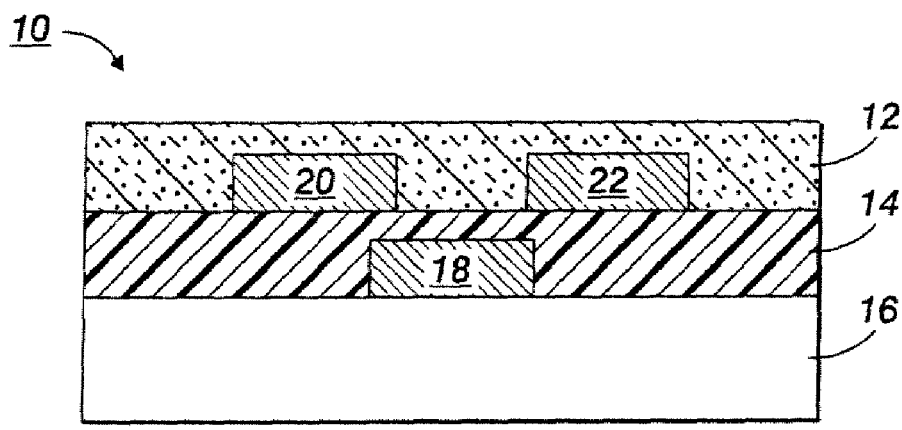
FIG. 1 is a first exemplary embodiment of a TFT of the present disclosure.

A more complete understanding of the components, processes, and devices disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

In FIG. 1, there is schematically illustrated an TFT configuration 10 comprised of a substrate 16, in contact therewith a metal contact 18 (gate electrode) and a layer of a gate dielectric layer 14 on top of which two metal contacts, source electrode 20 and drain electrode 22, are deposited. Over and between the metal contacts 20 and 22 is a zinc oxide semiconductor layer 12 as illustrated herein.

Figure 2:
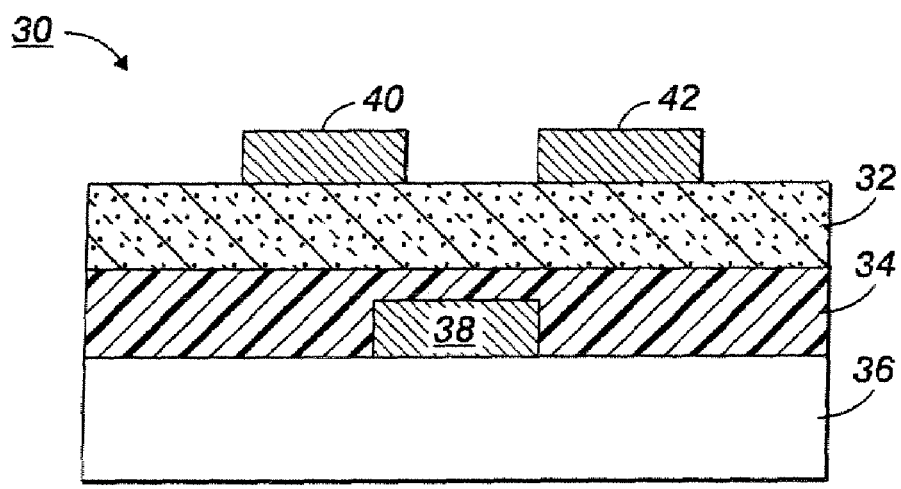
FIG. 2 is a second exemplary embodiment of a TFT of the present disclosure.

FIG. 2 schematically illustrates another TFT configuration 30 comprised of a substrate 36, a gate electrode 38, a source electrode 40 and a drain electrode 42, a gate dielectric layer 34, and a zinc oxide semiconductor layer 32.

Figure 3:
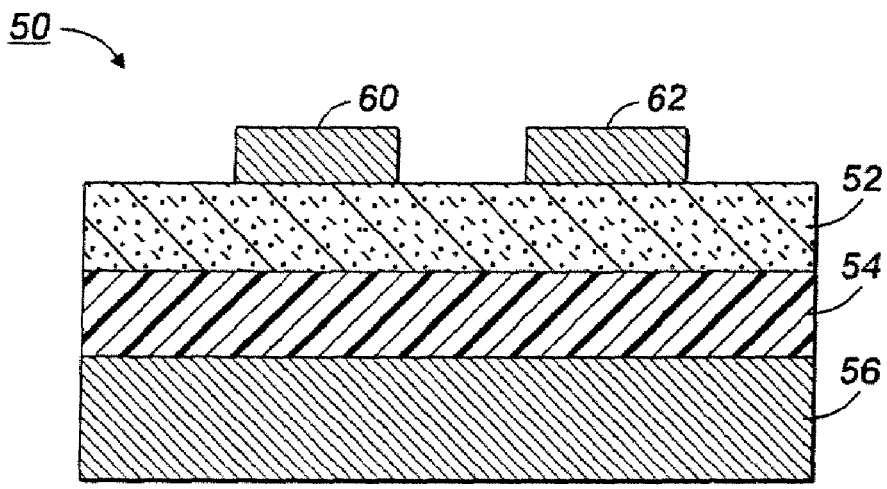
FIG. 3 is a third exemplary embodiment of a TFT of the present disclosure.

FIG. 3 schematically illustrates a further TFT configuration 50 comprised of substrate (not shown)/indium-tin oxide (ITO)/an aluminum-titanium oxide (ATO), wherein the ITO 56 is a gate electrode, and ATO 54 is a dielectric layer, and a zinc oxide semiconductor layer 52, on top of which are deposited a source electrode 60 and a drain electrode 62.

Figure 4:
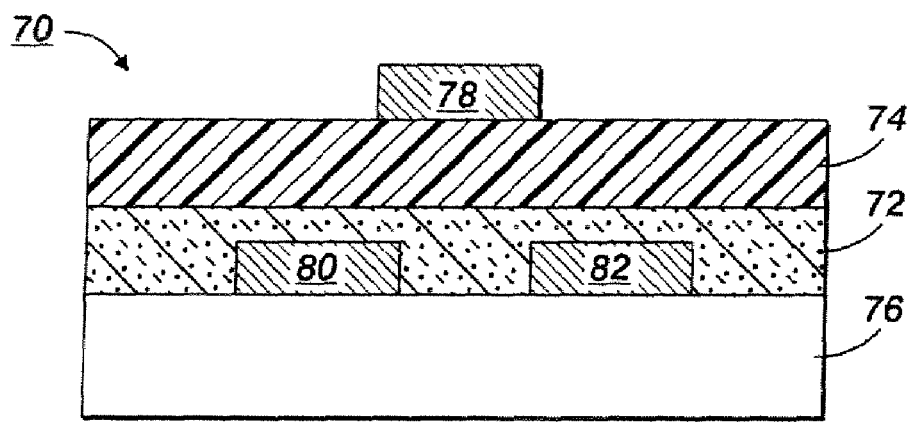
FIG. 4 is a fourth exemplary embodiment of a TFT of the present disclosure.

FIG. 4 schematically illustrates an additional TFT configuration 70 comprised of substrate 76, a gate electrode 78, a source electrode 80, a drain electrode 82, a zinc oxide semiconductor layer 72, and a gate dielectric layer 74.

The TFT of the present disclosure has a semiconductor layer comprising zinc oxide nanodisks oriented with their c-axis perpendicular to the plane of the dielectric layer or the substrate. The crystalline zinc oxide in the semiconductor layer is preferentially oriented with the c-axis perpendicular to the plane of the substrate. In embodiments, this preferential orientation refers to the crystalline zinc oxide in the semiconductor layer having a percentage of x-ray diffraction intensity of the (002) peak relative to the sum of intensities of (100), (002), and (101) peak, $I_{(002)}/[I_{(100)}+I_{(002)}+I_{(101)}] \times 100\%$, larger than about 40%, larger than about 60%, larger than about 80% (or from about 40% to about 100%, from about 60% to about 100%, from about 80% to about 100%). Electron transport has been found to be most favorable when the nanodisks are oriented in this manner.

The term "nanodisk" herein refers to a nanometer-sized object which has a 3-dimensional architecture with a height along the c-axis and a base along the (002) plane; the base can be a circular (or close to circular), polygonal, or irregular shape; the height of the disk is equal to or less than the diameter of the base. Zinc oxide nanoplates are also included herein as nanodisks. Each zinc oxide nanodisk may be a zinc oxide single crystal or may contain many zinc oxide crystals (polycrystalline); in the latter case, zinc oxide crystals in a nanodisk should have a preferential orientation with their c-axis perpendicular to the base of the nanodisk. Nanodisks and nanorods can be distinguished by their structure; in nanorods, the height of the nanorod is larger than the diameter of the base.

The dielectric layer or the substrate upon which the semiconductor layer is deposited may contain or be surface-modified to contain surface polar functional groups, such as —OH, —NH$_2$, —COOH, —SO$_3$H, —P(=O)(OH)$_2$, etc. It has been found that the (002) plane of the ZnO nanodisk, which is the most polar and has the highest surface energy, will strongly interact with the surface polar functional groups such that the nanodisks are preferentially oriented with their c-axis perpendicular to the dielectric layer or the substrate.

The semiconductor of the TFT of the present disclosure has a mobility of at least 1 cm$^2$/V·sec. This exceeds the mobility of most TFTs fabricated using other liquid deposition techniques.

The zinc oxide semiconductor layer of the present disclosure is made using a liquid deposition technique. The technique comprises depositing a composition comprising zinc oxide nanodisks over a dielectric layer, a substrate or other component of a TFT, optionally heating at a temperature below the deformation temperature of the substrate, and optionally cooling. These steps may also be repeated to form a thicker semiconductor layer made up of several smaller sublayers.

A complexing agent is optionally used in the zinc oxide nanodisk composition, which has the possible benefits of increasing the solubility or dispersing capability of zinc oxide nanodisks in a liquid, increasing the viscosity of the zinc oxide nanodisk composition to improve thin film uniformity, and facilitating the formation of preferentially oriented zinc oxide nanodisks in the films with the c-axis perpendicular to the resulting semiconductor layer. The complexing agent can be, for example, a carboxylic acid and an organoamine. In embodiments, the complexing agent is an organoamine selected for example from the group consisting of ethanolamine, aminopropanol, diethanolamine, 2-methylaminoethanol, N,N-dimethylaminoethanol, methoxyethylamine, methoxypropylamine, diaminoethane, diaminopropane, diaminobutane, diaminocyclohexane, and the like, and mixtures thereof.

Any suitable liquid(s) including, for instance, organic solvents and water can be used to disperse or dissolve zinc oxide nanodisks to form a zinc oxide nanodisk composition. Suitable organic solvents include hydrocarbon solvents such as pentane, hexane, cyclohexane, heptane, octane, nonane, decane, undecane, dodecane, tridecane, tetradecane, toluene, xylene, mesitylene, and the like; alcohols such as methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, and the like, ketones such as acetone, butanone, pentanone, cyclohexanone, and the like, tetrahydrofuran, chlorobenzene, dichlorobenzene, trichlorobenzene, nitrobenzene, cyanobenzene, acetonitrile, N,N-dimethylformamide, and mixtures thereof.

The concentration of the zinc oxide nanodisk composition is for example from about 1% to about 80% by weight, from about 2% to about 50% by weight, and particularly from about 5% to about 30%, by weight of the total zinc oxide nanodisk composition. The molar ratio of the optional complexing agent to zinc oxide nanodisks is for instance from about 0.1 to about 10, from about 0.2 to about 5, and particularly from about 0.5 to about 2.

In embodiments, other components can be incorporated in the composition comprising zinc oxide nanodisks. Such components include, for example, a polymer such as polystyrene, poly(methylmethacrylate, poly(vinylpyrollidone) and the like, meta nanoparticles of such as gold, silver, and the like, metal oxide nanoparticles of such as silicon oxide, gallium oxide, zirconium oxide, aluminum oxide, tin oxide, indium-tin oxide (ITO), and the like, and a mixture thereof.

Liquid depositing the zinc oxide nanodisk composition can be accomplished by any liquid deposition techniques such as for instance spin coating, blade coating, rod coating, dip coating, screen printing, microcontact printing, ink jet printing, stamping and the like.

In embodiments, the heating step, which is optionally used, refers to a heat treatment at a temperature or several temperatures within a range of between about 50° C. and about 300° C. The heating can be accomplished for example in an instant heating manner at a certain temperature using a pre-heated heating equipment. In embodiments, the heating can be accomplished in a gradual heating manner with a heating rate that the heating equipment can achieve, ranging from for example from about 0.5 to about 100° C. per minute starting from room temperature (about 25° C.) or starting from a temperature between about 25° C. to about 100° C. In further embodiments, the heating can also be accomplished stepwise at several temperatures, such as, for example, at about 100° C., then at about 200° C., and then at about 300° C. In embodiments, the heating can also be accomplished stepwise at several temperatures, combined with gradual heating. The heating can also be accomplished for instance at a higher temperature and then at a lower temperature such as first at about 300° C. and then at about 200° C.

In embodiments, "cooling", which is optionally used, refers to bringing the temperature of the deposited composition to a temperature below about 100° C., and particularly to about room temperature (that is, about 25° C.). The cooling can be accomplished for instance in a self-cooling manner by turning off the heating equipment or in a controlled manner at a certain cooling rate such as for example from about 0.1° C./min to about 100° C./min. In embodiments, a slow cooling such as at a cooling rate of about 0.1° C./min to about 10° C./min may be employed especially from a temperature higher than about 300° C. to reduce mechanical strain in the semiconductor layer(s) and the substrate.

The size of zinc oxide nanodisks used in embodiments can have a base diameter of from about 1 nm to about 1000 nm. In specific embodiments, the base diameter is from about 1 nm to about 500 nm. In further embodiments, the base diameter is from about 2 nm to about 100 nm. The zinc oxide nanodisks can have a height of from about 0.5 nm to about 1000 nm in height. In specific embodiments, the height is from about 0.5 nm to about 500 nm. In further embodiments, the height is from about 1 nm to about 100 nm. Illustrative examples for preparation of zinc oxide nanodisks can be found in several articles. M. Monge, M. L. Kahn, A. Maisonnat, and B. Chaudret, "Room-Temperature Organometallic Synthesis of Soluble and Crystalline ZnO Nanoparticles of Controlled Size and Shape", Angew. Chem. vol. 115, 5479-5482 (2003), described a method by using dicyclohexyl zinc and organoamines in tetrahydrofuran at room temperature to synthesize zinc oxide nanodisks with diameters of 3-5 nm. Y. Peng, A. Xu, B. Deng, M. Antonietti, and H. Coolfen, "Polymer-Controlled Crystallization of Zinc Oxide Hexagonal Nanorings and Disks", J. Phys. Chem. B vol. 110, 2988-2993 (2006), disclosed a method for preparation of zinc oxide nanodisks of 400 nm to 1000 nm in diameter by heating an aqueous $Zn(NO_3)_2$ solution which contains carboxyl-modified polyacrylamide.

The zinc oxide semiconductor layer of the present disclosure can be used in electronic devices such as large area displays, radio-frequency identification (RFID) tags, etc. which use thin film transistors with high field-effect mobility of for example greater than 1 $cm^2/V \cdot s$.

The zinc oxide semiconductor layer has a thickness ranging for example from about 10 nanometers to about 1 micrometer, particularly a thickness of from about 20 to about 200 nanometers. The TFT devices contain a semiconductor channel with a width, W and length, L. The semiconductor channel width may be, for example, from about 0.1 micrometers to about 5 millimeters, with a specific channel width being about 5 micrometers to about 1 millimeter. The semiconductor channel length may be, for example, from about 0.1 micrometer to about 1 millimeter with a more specific channel length being from about 5 micrometers to about 100 micrometers.

The substrate may be composed of any suitable materials for instance silicon, glass, aluminum, or plastics. The thickness of the substrate may be from about 10 micrometers to over 10 millimeters with a representative thickness being from about 1 to about 10 millimeters for a rigid substrate such as glass plate or silicon wafer.

The gate electrode can be a thin metal film, a conducting polymer film, a conducting film made from conducting ink or paste or the substrate itself, for example heavily doped silicon. Examples of gate electrode materials include but are not restricted to aluminum, nickel, gold, silver, copper, zinc, indium, zinc-gallium oxide, indium tin oxide, indium-antimony oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors. Typical materials suitable for use as source and drain electrodes include those of the gate electrode materials such as aluminum, zinc, indium, conductive metal oxides such as zinc-gallium oxide, indium tin oxide, indium-antimony oxide, conducting polymers and conducting inks. Typical thicknesses of source and drain electrodes are about, for example, from about 40 nanometers to about 1 micrometer with the more specific thickness being about 100 to about 400 nanometers.

The gate dielectric layer generally can be an inorganic material film or an organic polymer film. Illustrative examples of inorganic materials suitable as the gate dielectric layer include aluminum-titanium oxide, aluminum oxide, silicon oxide, silicon nitride, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate)s, epoxy resin and the like. The thickness of the gate dielectric layer is, for example from about 10 nanometers to about 2000 nanometers depending on the dielectric constant of the dielectric material used. An representative thickness of the gate dielectric layer is from about 100 nanometers to about 500 nanometers. The gate dielectric layer may have a conductivity that is for example less than about $10^{-12}$ S/cm.

In embodiments, the gate dielectric layer, the gate electrode, the semiconductor layer, the source electrode, and the drain electrode are formed in any sequence with the gate electrode and the semiconductor layer both contacting the gate dielectric layer, and the source electrode and the drain electrode both contacting the semiconductor layer. The phrase "in any sequence" includes sequential and simultaneous formation. For example, the source electrode and the drain electrode can be formed simultaneously or sequentially.

For a n-channel TFT, the source electrode is grounded and a bias voltage of generally, for example, about 0 volt to about 80 volts is applied to the drain electrode to collect the charge carriers transported across the semiconductor channel when a voltage of generally about −20 volts to about +80 volts is applied to the gate electrode.

In embodiments, the zinc oxide semiconductor layer in a TFT device generally exhibits a field-effect mobility of greater than for example about 1 cm$^2$Ns (square centimeter per Volt per second), and an on/off ratio of greater than for example about 10$^3$. On/off ratio refers to the ratio of the source-drain current when the transistor is on to the source-drain current when the transistor is off.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position size, shape, angle, color, or material.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin film transistor, comprising:
 a substrate;
 a gate electrode a source electrode and a drain electrode;
 a dielectric layer; and
 a semiconductor layer;
 wherein the semiconductor layer comprises zinc oxide nanodisks oriented with their c-axis perpendicular to the dielectric layer or the substrate; and
 wherein the zinc oxide nanodisks have a height of from about 1 nanometer to about 100 nanometers.

2. A thin film transistor, comprising:
 a substrate;
 a gate electrode, a source electrode, and a drain electrode;
 a dielectric layer; and
 a semiconductor layer, wherein the semiconductor layer comprises zinc oxide nanodisks oriented with their c-axis perpendicular to the substrate;
 wherein the zinc oxide nanodisks have a height of from about 1 nanometer to about 100 nanometers.

3. A thin film transistor, comprising:
 a polymeric substrate;
 a gate electrode, a source electrode, and a drain electrode;
 a dielectric layer; and
 a semiconductor layer, wherein the semiconductor layer comprises zinc oxide nanodisks oriented with their c-axis perpendicular to the dielectric layer;
 wherein the zinc oxide nanodisks have a height of from about 1 nanometer to about 100 nanometers.

* * * * *